(12) United States Patent
Freimann et al.

(10) Patent No.: US 8,228,485 B2
(45) Date of Patent: Jul. 24, 2012

(54) PROJECTION ILLUMINATION SYSTEM

(75) Inventors: Rolf Freimann, Aalen (DE); Jens Philipps, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1043 days.

(21) Appl. No.: 12/129,235

(22) Filed: May 29, 2008

(65) Prior Publication Data

US 2009/0002663 A1 Jan. 1, 2009

Related U.S. Application Data

(63) Continuation of application No. PCT/EP2006/011419, filed on Nov. 28, 2006.

(30) Foreign Application Priority Data

Nov. 29, 2005 (DE) .......................... 10 2005 056 914

(51) Int. Cl.
*G03B 27/42* (2006.01)
*G03B 27/54* (2006.01)

(52) U.S. Cl. .......................... 355/53; 355/67

(58) Field of Classification Search .............. 355/52, 355/53, 55, 57, 67
See application file for complete search history.

(56) References Cited

U.S. PATENT DOCUMENTS

| | | | |
|---|---|---|---|
| 3,614,235 A | 10/1971 | Munnerlyn | |
| 4,872,755 A | 10/1989 | Kuechel | |
| 5,113,064 A | 5/1992 | Manhart | |
| 5,136,413 A | 8/1992 | MacDonald et al. | |
| 5,898,501 A | 4/1999 | Suzuki et al. | |
| 5,973,863 A | 10/1999 | Hatasawa et al. | |
| 6,244,717 B1 | 6/2001 | Dinger | |
| 6,344,898 B1 | 2/2002 | Gemma et al. | |
| 6,614,535 B1 | 9/2003 | Kakuchi et al. | |
| 6,784,977 B2 | 8/2004 | Von Buenau et al. | |
| 7,090,362 B2 | 8/2006 | Holderer et al. | |
| 2002/0001088 A1 | 1/2002 | Wegmann et al. | |
| 2004/0012866 A1 | 1/2004 | Mann et al. | |
| 2004/0036940 A1 | 2/2004 | Hazelton et al. | |
| 2004/0174531 A1 | 9/2004 | Freimann | |
| 2005/0140950 A1* | 6/2005 | Franken et al. | ................ 355/53 |
| 2005/0162762 A1 | 7/2005 | Novak | |

FOREIGN PATENT DOCUMENTS

DE 195 11 926 A1 10/1996
(Continued)

OTHER PUBLICATIONS

Malacara, Daniel, "Optical Shop Testing", 2nd Edition, Chapter 14: Phase Shifting Interferometry by J.E. Greivenkamp et al., Wiley Interscience Publication (1992), pp. 501-589.

(Continued)

*Primary Examiner* — Peter B Kim
(74) *Attorney, Agent, or Firm* — Sughrue Mion, PLLC

(57) ABSTRACT

A projection illumination system with a plurality of optical components (29, 32) includes an interferometer arrangement (37) whose components are arranged outside a projection beam path (17) of the projection illumination system. Measurement radiation of the interferometer arrangement strikes a surface (35) of the optical component (29) to be measured under a large angle of incidence ($\alpha$). Actuators (83, 87) of the projection illumination system can be actuated as a function of a measurement radiation intensity distribution detected using the interferometer arrangement in order to change imaging characteristics of the projection illumination system and to keep them stable in particular also with respect to drifting.

32 Claims, 9 Drawing Sheets

FOREIGN PATENT DOCUMENTS

| | | |
|---|---|---|
| DE | 100 04 580 A1 | 8/2001 |
| DE | 102 23 581 A1 | 12/2003 |
| EP | 1 174 770 A2 | 1/2002 |
| EP | 1 327 172 A1 | 7/2003 |
| EP | 1 480 082 A1 | 11/2004 |
| JP | 63-298107 A | 12/1988 |
| JP | 03-128411 A | 5/1991 |
| JP | 2000-097666 A | 4/2000 |
| JP | 2001-215105 A | 8/2001 |
| JP | 2003-269909 A | 9/2003 |
| JP | 2005-156446 A | 6/2005 |
| JP | 2005-172454 A | 6/2005 |
| WO | 03/050586 A2 | 6/2003 |
| WO | 2004/003467 A1 | 1/2004 |
| WO | 2005/029192 A2 | 3/2005 |

OTHER PUBLICATIONS

S. Brinkmann et al., "Interferometric testing of plane and cylindrical workpieces with computer-generated holograms", Opt. Eng. 37(9) pp. 2506-2511 (Sep. 1998).

S. Brinkmann et al., "Streifende-Inzidenz-Interferometrie mit diffraktiven Elementen fuer die Formmessung von Mantelflaechen stabfoermiger Objekte I: Messprinzip and Theorie" ("Grazing Incidence Interferometry Using Diffractive Optical Elements for the Shape Measurements of the Mantle Surface of Rod-shaped Objects I: Measuring Priciple and Theory"), tm—Technisches Messen 67 (2000), Oldenbourg Verlag, pp. 10-19.

G.E. Sommargren et al., "100-picometer interferometry for EUVL", Proceedings of SPIE vol. 4688 (2002), pp. 316-328.

* cited by examiner

PROJECTION ILLUMINATION SYSTEM

This application is a Continuation of International Application No. PCT/EP2006/011419, filed Nov. 28, 2006, which was published under PCT Article 21(2) in the German language and which claims priority to German Application No. 10 2005 056 914.5, filed Nov. 29, 2005. These Applications, in their entirety, are incorporated herein by reference.

BACKGROUND OF THE INVENTION

1. Field of the Invention

The invention relates to a projection illumination system.

Lithographic methods are conventionally employed for the manufacturing of miniaturized structures and components. Miniaturized components and structures include, for example, integrated circuits, fluid crystal elements, micromechanical components and the like. Hereby, patterns or structures predetermined on a mask ("reticle") are imaged onto a radiation sensitive substrate, such as, for example, a wafer provided with a radiation sensitive layer ("resist"), by an imaging optics of a projection illumination system. The light required for the imaging is generated by an illumination system of the projection illumination system, which comprises an illumination optics for illuminating the mask.

With the continued trend towards increasing miniaturizing of the components to be manufactured, greater and greater demands are made on the imaging quality of projection illumination systems.

2. Brief Description of Related Art

A projection illumination system is known, for example, from US 2002/0001088 A1, in which particular parameters characterizing the imaging quality can be determined by an interferometric measurement of the imaging optics. An imaging optics is, for example, known from U.S. Pat. No. 5,973,863 which comprises actuators which adjust a position of at least one optical element of the imaging system relative to other elements of the imaging system. Thus it is possible to reduce certain imaging errors of the imaging optics by correspondingly controlling the actuators.

Due to the large number of optical components in a projection illumination system, the imaging quality is determined by a multitude of parameters of the optical components and is also subject to operation related drifts.

SUMMARY OF THE INVENTION

The present invention has been accomplished taking the above problems into consideration.

It is an object of the invention to provide a projection illumination system which enables at least one of the acquiring of parameters of individual components of the system and the acquiring of changes over time of parameters of the components of the system.

According to an embodiment of the invention, a projection illumination system comprises several optical components which are arranged in the beam path of projection radiation with which the projection illumination system is operated, and an interferometer arrangement for inspecting at least one of these optical components using measuring radiation, wherein the measuring radiation is incident at an angle of incidence of at least 30° with respect to surface normals of the optical face of the optical component onto the optical face, and wherein at least one diffractive optical element is arranged in the beam path of the measuring radiation.

According to an embodiment of the invention, a projection illumination system for exposing a substrate with a pattern comprises an illumination optics for illuminating a pattern defining structure with projection radiation, and a projection optics for transferring projection radiation interacting with the pattern defining structure onto the substrate, wherein the illumination optics and the projection optics each comprise a plurality of optical components, wherein the projection illumination system comprises at least one interferometer arrangement for measuring an optical component of the plurality of optical components, wherein the interferometer arrangement comprises a measuring radiation source, a beam forming optics, a back reflector having a first diffraction grating, and a two-dimensionally positionally resolving radiation detector, which are arranged outside a beam path of the projection radiation through the projection illumination system and which are configured such that: measuring radiation emitted from the measuring radiation source through the beam forming optics is incident onto a first extended region of an optical surface of the optical component to be measured as an extended radiation bundle, measuring radiation being incident onto the optical surface is incident after a first interaction with the optical component to be measured onto the back reflector as an extended radiation bundle, measuring radiation reflected at the first diffraction grating of the back reflector is incident onto a second extended region of an optical surface of the optical component to be measured, measuring radiation being incident onto the second extended region of the optical surface enters the beam forming optics after a second interaction with the optical component to be measured as an extended radiation bundle, and the measuring radiation entering the beam forming optics is incident in superposition with reference radiation onto the two-dimensionally positionally resolving detector.

The interferometer arrangement allows the acquisition of parameters of the optical component onto which the measuring radiation beam is directed. Since the measuring radiation beam is incident onto an extended region of the surface of the optical component, it is possible to acquire location dependent parameters and changes over time of the same. Hereby, the location dependent parameter may be a surface shape of the region of the optical surface onto which the measuring radiation beam is directed. The location dependent parameter may also be a distribution of a refractive index of a substrate material of the optical component, as long as the measuring radiation beam traverses the substrate material.

In that the components of the interferometer arrangement are arranged outside the beam path of the projection radiation, it is possible to acquire these parameters during an exposure operation of the projection illumination system without thereby impairing this operation. Thus, an online acquiring of these parameters during the operation is possible, wherein, in particular, time dependent drifts of these parameters may be acquired. Such drifts may, for example, be caused by thermal changes at the projection illumination system during the exposure operation. For example, optical components, such as one of lenses and mirrors of the projection illumination system, may be heated up due to the incidence of projection radiation onto them, resulting in changes to the surface shapes of these optical components. A refractive index and a distribution of the refractive index in a substrate material of a lens may also change during the operation. The changes of the refractive index may be caused by heating, as well as by a radiation induced structural change, such as compaction and rarefaction of the substrate material.

According to an embodiment of the invention, the measuring radiation is incident onto the optical surface in an inclined way, for example upon an average angle of incidence of greater than 30°. Thereby, it is, in particular, possible to fix the interferometer arrangement between structural components of the projection illumination system, such as frames and holders of the optical components in a space saving manner. In particular, it is possible to supplement already existing projection illumination systems with an interferometer arrangement to acquire parameters and drifts of parameters, respectively, of the optical components.

According to an embodiment, an extended region of the optical surface onto which the measuring radiation beam is directed is a relatively large portion of more than 10%, in particular more than 20%, of the surface of the optical component effective for the projection radiation.

Due to the extension of the interaction region of the optical surface, and due to the inclined incidence of the measuring radiation beam onto this region of the optical surface, the potentially present symmetry of wavefronts of the measuring radiation beam before they are incident onto the optical surface will no longer be present after the interaction with the optical component. According to an embodiment of the invention, then the first diffraction grating of the back reflector is configured such that radiation of the measuring radiation beam which is incident onto the diffraction grating as an extended beam is substantially reflected back into itself at each location of incidence, such that each partial beam bundle of the beam which is returned from the back reflector substantially traverses the same path back it took, when it propagated towards the back reflector. Deviations of the coincidence between the path towards the back reflector and the path back from the back reflector of individual partial beam bundles are possible and contribute to the effect of a parameter change acquired by the interferometer arrangement. In other words, changes in a parameter of the optical component will normally lead to a change of the coincidence of the path towards the back reflector and the path back from the back reflector, and thus to a change of the interference pattern acquired by the radiation detector. From an analysis of the interference pattern it is then possible to infer the change in the parameter.

The manufacturing of a diffraction grating carrying out the function of the back reflector as desired is technically possible. For example, the propagation of the measuring radiation beam in the interferometer arrangement, including the interaction with the optical component, may be simulated by a computer, so that the angle of incidence of the individual partial beam bundles of the measuring radiation beam onto the diffraction grating can be computed. In dependence on the thus computed angle of incidence distribution across locations of the diffraction grating, it is then possible to determine positionally dependent line densities of the diffraction grating, such that at least a portion of the measuring radiation being incident onto the diffraction grating is reflected back into itself at a predetermined diffraction order, to eventually be incident onto the radiation detector after a further interaction with the optical component. It is then possible to manufacture a corresponding diffraction grating upon presetting the line density distribution. Such a diffraction grating is conventionally called a computer generated hologram (CGH). Such a CGH may, starting from a mathematical description of the line density distribution, be manufactured by conventionally know methods, such as an electron beam writer, a lithography device, a laser beam writer and the like.

According to embodiments of the invention, the line density varies by more than a factor of 2, in particular by more than a factor of 3, between different locations on the diffraction grating.

According to an embodiment, the beam forming optics also comprises a diffraction grating. The diffraction grating may also be a CGH which is configured such that it shapes the measuring radiation beam being incident onto the optical surface, and is adapted to the geometry of the optical component so that the beam is incident onto the extended region of the optical surface.

According to an embodiment, the interferometer arrangement comprises a reference light reflector arranged in a beam path between the measuring radiation source and the beam forming optics, to separate off the reference radiation from the radiation of the measuring radiation source required for generating the interference pattern. Hereby, the reference light reflector may be a semi-transparent mirror. Thereby, the interferometer arrangement assumes a construction referred to as Fizeau-interferometer, wherein the semi-transparent mirror typically is a plane mirror which is orthogonally arranged in the as parallel beam adapted measuring radiation beam between the measuring radiation beam source and the beam forming optics.

The reference light reflector may, according to another embodiment, also comprise a further diffraction grating. This diffraction grating may be configured such that the reference light is reflected towards the radiation detector at an angle with respect to the incident measuring radiation in such a way that an additional beam splitter, normally present in the conventional Fizeau construction, is not necessary.

According to another embodiment, the interferometer arrangement uses the advantages of the technology of phase shift interferometry (PSI). Thereby, in one measurement, multiple interference patterns are detected, wherein in each case different phase shifts are generated in the beam path of the interferometer arrangement. For generating the phase shifts, different embodiments provide the possibility to vary the wavelength of the measuring radiation, to vary the position of the beam shaping optics, to vary the position of the back reflector, to vary the position of the reference light reflector, and the like.

According to an embodiment, the measuring radiation reflected from the back reflector and supplied to the radiation detector is reflected during the interaction with the optical component at its optical surface. This possibility is particularly suited for acquiring changes of a surface shape of the optical surface. This possibility is applicable to optical components which are one of mirrors and lenses.

According to a further embodiment, the optical component is a lens, and the measuring radiation reflected back from the back reflector and supplied to the radiation detector for interaction with the optical component is refracted at a first surface of the lens, traverses its substrate material, is reflected at the second surface of the lens at an inner side, traverses the substrate material a second time, and finally leaves the lens through the first surface of the lens. This possibility is particularly suited for acquiring changes of a refractive index of the lens material.

BRIEF DESCRIPTION OF THE DRAWINGS

The forgoing as well as other advantageous features of the invention will be more apparent from the following detailed description of the exemplary embodiments of the invention with reference to the accompanying drawings. It is noted that not all possible embodiments of the present invention necessarily exhibit each and every, or any, of the advantages identified herein.

Embodiments of the invention are explained in more detail in the following with reference to the Figures. Hereby.

DETAILED DESCRIPTION OF EXEMPLARY EMBODIMENTS

Figure 1:
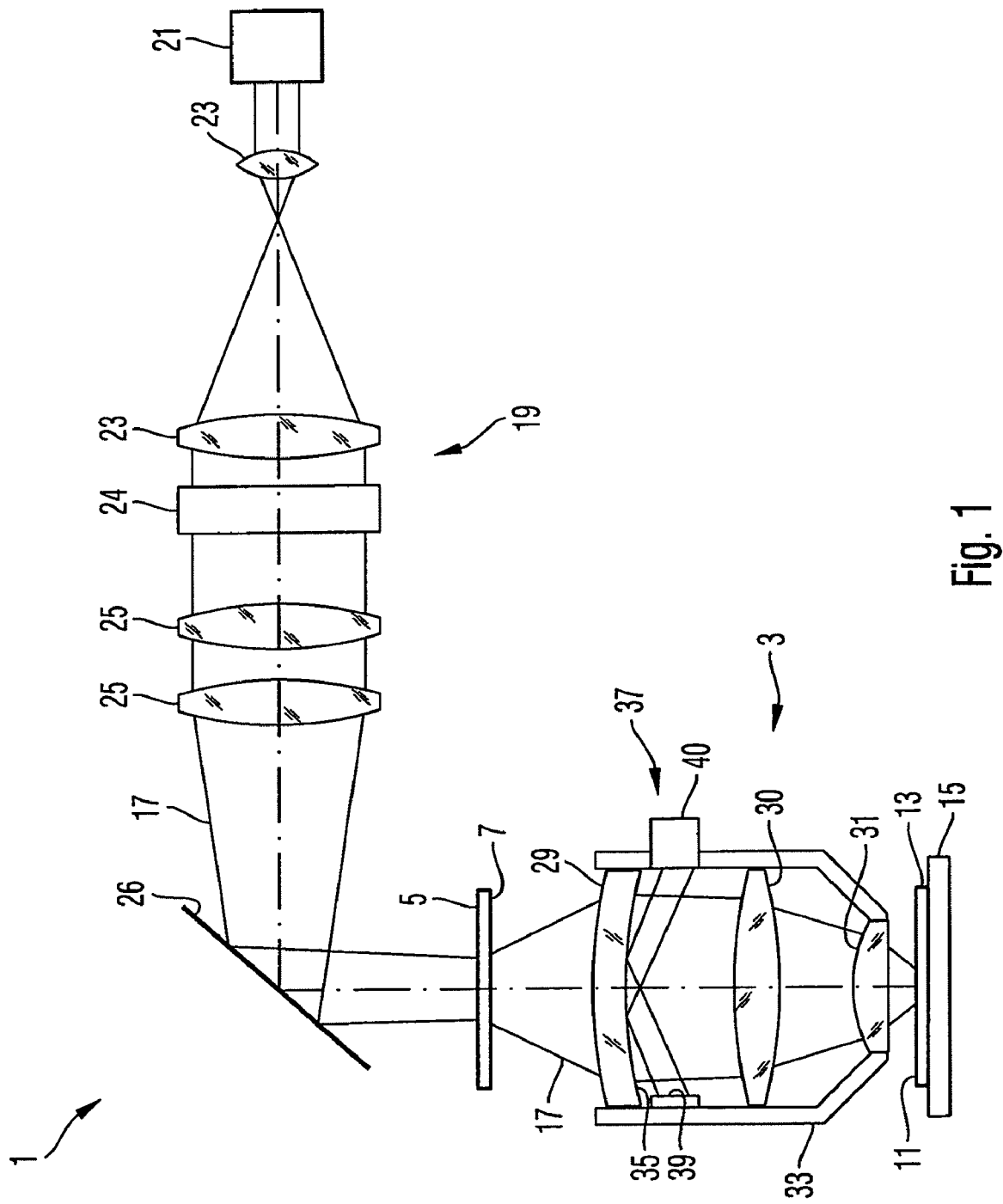
FIG. 1 shows a projection illumination system according to a first embodiment of the invention.

In the exemplary embodiments described below, components that are at least analogous in function and structure are designated as far as possible by like reference numerals. Therefore, to understand the features of the individual components of a specific embodiment, the descriptions of other embodiments and of the summary of the invention should be referred to.

FIG. 1 shows a schematic illustration of a projection illumination system according to an embodiment of the invention. The projection illumination system 1 comprises a projection optics 3 for imaging a photo mask 7 provided on a mask holder 5 to a surface 11 of a semiconductor wafer 13 covered with photoresist, wherein the semiconductor wafer is held on a wafer table 15.

The mask 7 is exposed with projection radiation 17 which is generated by an illumination optics 19. For generating the projection radiation, the illumination optics 19 comprises a radiation source 21, for example a KrF-Excimer laser, which generates projection radiation of a wavelength of 248 μm. The radiation emitted from the source 21 is appropriately shaped by a plurality of optical components to be, according to a desired angle distribution and preferably homogeneous distribution with respect to position, incident onto a region of the mask 7 to be imaged. The optical components of the illumination optics 19 are only schematically indicated in FIG. 1 and comprise components 23 of a collimating optics, an integrator 24, and further components 25 for shaping the beam. The components 25 are schematically indicated as lenses in FIG. 1, but may also comprise other elements, such as diffraction gratings, polarizers and others. The projection radiation is directed onto the mask 7 via a mirror 26.

A predetermined pattern on the mask 7 is transferred by the projection optics 3 onto the wafer 13. The projection optics 3 comprises a plurality of lenses, only three of which, lenses 29, 30 and 31, are exemplarily shown in FIG. 1. The lenses are held in a casing 33 of the projection optics 3. For acquiring changes of a surface shape of a region of a surface 35 of the lens 29 the projection optics comprises an interferometer arrangement 37 having a back reflector 39 and further components which are schematically illustrated as box 40 in FIG. 1 and are explained in more detail in the following. The components of the interferometer arrangement 37 are arranged outside a beam path of the projection radiation 17.

In FIG. 1, the interferometer arrangement 37 for measuring parameters of the lens 29 is only exemplarily shown. However, also provided is a corresponding interferometer arrangement for measuring parameters of other optical components, such as further lenses 30, 31, lenses of the projection optics 3, not illustrated in FIG. 1, or also of components of the illumination optics 19, such as components 23, 24, 25, and 26 schematically illustrated in FIG. 1, as well as of further components of the illumination optics 19 not shown in the schematic illustration of FIG. 1.

The optical components of the projection optics 3 of FIG. 1 are only lenses. However, it is also possible to apply the principles of the invention to other projection optics, such as, for example, catadioptric projection optics which comprise, in addition to lenses, at least one mirror having a curved mirror face.

Figure 2:
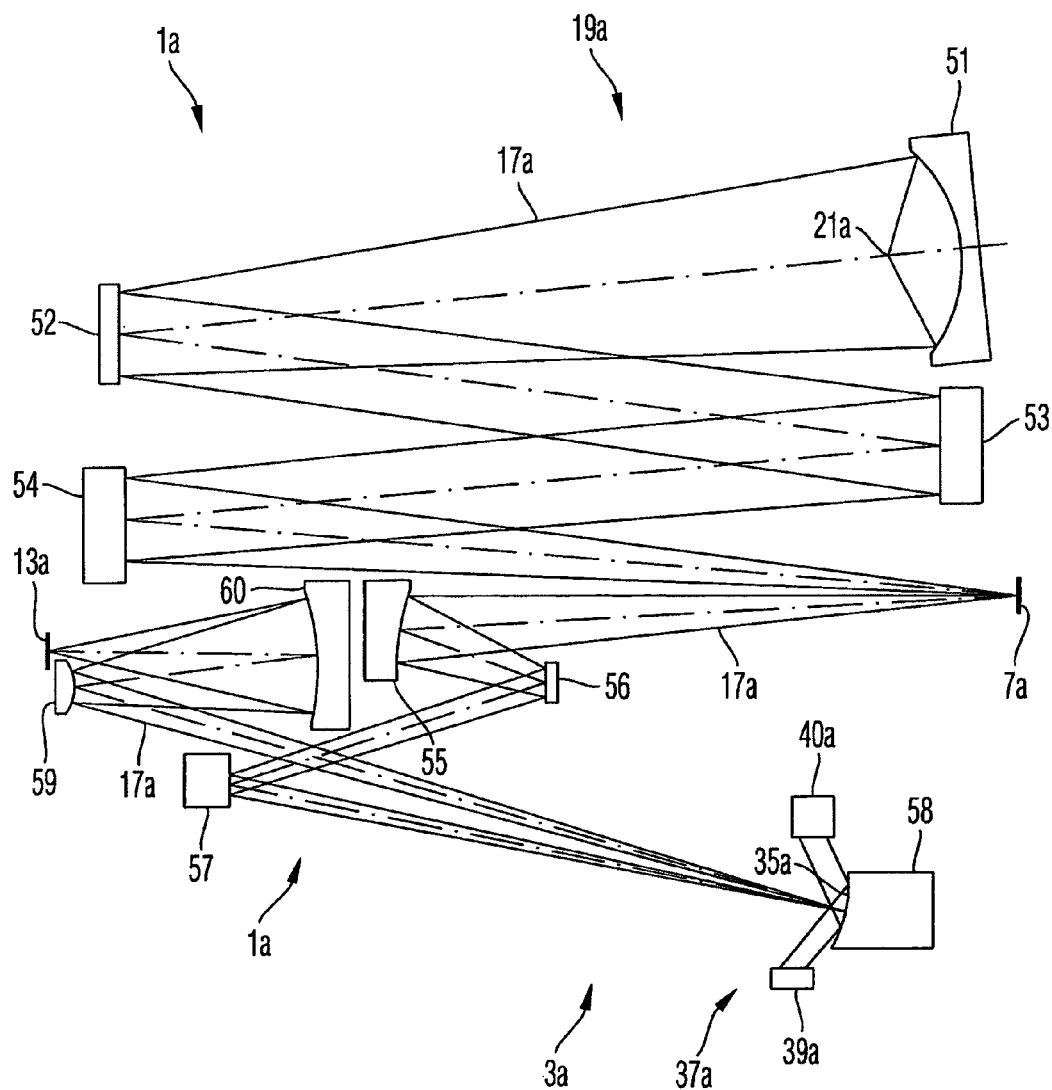
FIG. 2 shows a projection illumination system according to a second embodiment of the invention.

FIG. 2 schematically shows the construction of a catoptric illumination system 3a having only mirrors as optical components. This projection illumination system 1a comprises a projection optics 3a for imaging a pattern generating structure 7a onto a semiconductor wafer 13a, and an illumination optics 19a for illuminating the pattern generating structure 7a with projection radiation 17a. The projection radiation 17a is generated by a radiation source 21a, for example comprising a plasma source for generating EUV-radiation. The illumination optics 19a shapes the projection radiation 17a via mirrors 51, 52, 53 and 54, such that the projection illumination is incident onto the pattern forming structure 7a according to a desired angle distribution. The pattern forming structure 7a reflects projection radiation according to the pattern to be constituted, and the projection optics 3a generates the pattern to be imaged onto the wafer 13a using mirrors 55, 56, 57, 58, 59, and 60. Surface shapes of the mirrors 51 to 60 may change during the operation of the projection illumination system 1a, and thus may deteriorate an imaging quality of the system. Therefore, each of the mirrors 51 to 60 may be associated with an interferometer arrangement which is configured similar to the interferometer arrangement 37 shown in FIG. 1, and which is described in detail in the following. In the embodiment illustrated in FIG. 2, only the mirror 58 is associated with an interferometer arrangement 37a, also only schematically illustrated there, to acquire changes of a shape of a surface 35a of the mirror 58.

Details of the interferometer arrangement 37 of FIG. 1 are explained in the following, with reference to FIG. 3. The interferometer arrangement 37 comprises a radiation source 63 for measuring radiation 65. The radiation source 63 may, for example, be a Helium-Neon laser emitting the measuring radiation 65 having a wavelength of 632.8 nm. The measuring radiation 65 is collimated by collimating optics 66, schematically illustrated, and is reflected at a beam splitter 67. It then traverses a wedge plate 68 having a partly reflecting face 68a, orientated orthogonally with respect to the beam direction of the measuring radiation 65 traversing the wedge plate 68, which partly reflecting face 68a forms a Fizeau face of the interferometer arrangement 37. Measuring radiation reflected at the Fizeau face 68a serves as reference radiation, traverses the beam splitter 67 in a straight line and is projected onto a two-dimensionally positionally resolving radiation detector 70 by a camera optics 69a. The radiation detector 70 may be a CCD detector exhibiting a plurality of pixels 71 arranged in a two-dimensional pattern. A portion of the measuring radiation 65 traversing the Fizeau face 68a enters an inside of the casing via a window 71 mounted in the casing 33 of the projection optics 37. A vacuum may be provided inside the casing, for example, or a gas atmosphere of an appropriate gas exhibiting a low interaction with the projection radiation 17.

At an inner surface of the window 71, a CGH 73 is provided which is configured such that the measuring radiation collimated as a parallel beam and being incident onto the CGH 73 is diffracted by the CGH, for example according to a first diffraction order, and is thus expanded so that the measuring radiation is incident onto an extended region 61 onto the surface 35 of the lens 29. From there, the measuring radiation is reflected and is incident, again as an extended beam bundle, onto a further CGH 75 of the back reflector 39 which is configured such that the measuring radiation being incident onto the CGH 75 is reflected back, preferably exactly, into itself. Therefore, the CGH 75 serves the function of a back reflector for the radiation which is reflected at the CGH according to a given diffraction order, for example the first diffraction order.

The back reflected measuring radiation is then again incident onto an extended region of the optical surface 35 of the lens 29. This extended region will coincide with the extended region 61 onto which the measuring radiation coming from the beam shaping optics 73 is incident, as long as the condition of exact back reflection is satisfied. The measuring radiation incident from the CGH 75 onto the region 61 is again reflected at the optical surface 35 and is incident onto the CGH 73 and is shaped by the CGH to a substantially parallel measuring radiation beam, which traverses the Fizeau face 68a and wedge plate 68, then traverses the beam splitter 67, and is projected through the camera optics 69a onto the detector 70, so that an interference pattern is generated on the detector 70 due to the interferent superposition of the reference radiation reflected at the Fizeau face 68a with the measuring radiation which has interacted twice in the region 61 with the surface 35 of the lens 29. This interference pattern is read from the detector 70 into a controller 81.

The entire construction of the components of the interferometer arrangement 37 and the lens 29 can be simulated numerically, so that the generated interference pattern can be computed by methods, for example, of ray tracing for the known geometry of the components. By comparing the measured interference pattern to the computed interference pattern it is then possible, upon suitable calibration of the components of the interferometer arrangement 37, to infer deviations of a surface shape of the optical face 35 in the region 61 from a target shape.

Even if a generated interference pattern may not exactly be predicted by numerical computation, it is anyway possible to acquire changes of the interference pattern over time. From such changes it is then possible to determine changes of the optical face 35 in the region 61. For example, it is then possible to decide whether a radius or curvature of the surface 35 in the region 61 increases or decreases over time. Such a change of the radius of curvature may, for example, be caused by heating of the lens 29 due to the projection radiation 17.

The change of the radius of curvature, or of another parameter of the surface shape of the optical face 35, may cause a change, and possibly a deterioration, of the imaging quality of the projection optics 37. By the interferometer arrangement 37, such changes can be acquired and measures can be implemented to counteract such changes of the imaging quality. Purely as an example, FIG. 3 shows a lens 32 of the projection optics 37 which is held at the casing 33 using a holder 83, which plural piezoelectric actuators 85 support, which in turn carry a frame 87 of the lens 32. The piezoelectric actuators 85 are controlled by the controller 81, to change a position of the lens 32 relative to the lens 29. Thus, when the surface shape of the lens surface 35 changes, it is possible to displace the position of the lens 32 relative to the lens 29 such that a change of the imaging quality of the projection optics 37 due to the change of the surface shape of the surface 35 is preferably compensated for.

Figure 3:
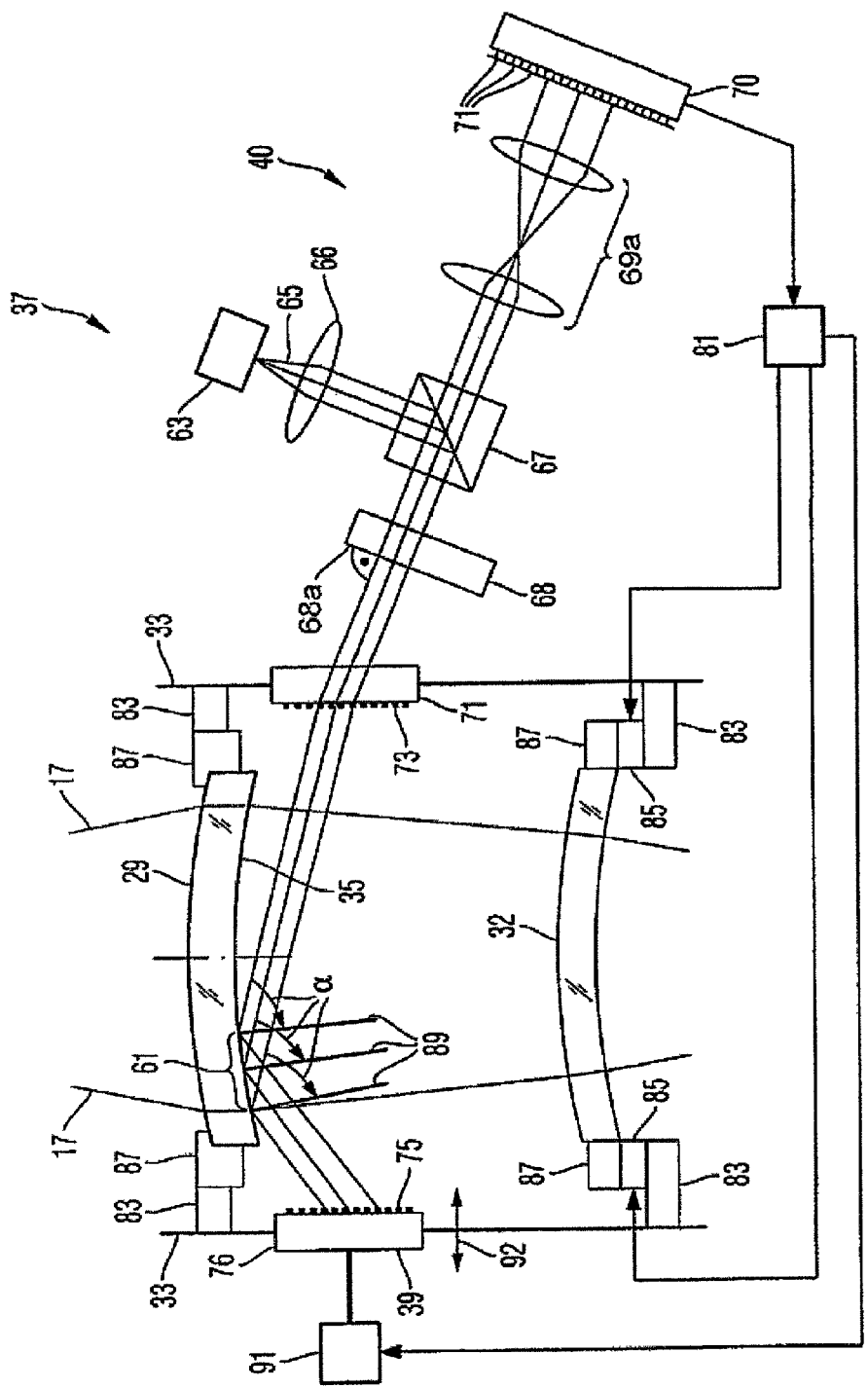
FIG. 3 shows a detailed view of an interferometer arrangement, as integrated into the projection illumination systems of FIGS. 1 and 2.

FIG. 3 shows another actuator 91 which is configured to displace the CGH 75 in a direction denoted in FIG. 3 by an arrow 92, to generate a phase shift of the measuring radiation returned from the CGH 75 and thus to generate a phase shift in the interference pattern acquired by the detector 70. Thus, it is possible to exploit the principles of the phase shifting interferometry (PSI) and to acquire, using the detector 17, for measuring the optical surface 35 in the region 61, multiple interferograms having different respective positions of the CGH 75. An evaluation of the multiple interferograms is advantageous with respect to the accuracy and unambiguity of the performed measurement. Background information regarding phase shifting interferometry may be found in Chapter 14 of the textbook by Daniel Malacara, Optical Shop Testing, 2nd Edition, Wiley Interscience Publication (1992).

The interferometer arrangement shown in detail in FIG. 3 serves to measure the surface shape of the surface 35 of the lens 29 of the projection illumination system shown in FIG. 1. However, it is also possible to acquire surface shapes of other optical components of the projection illumination system of FIG. 1 with a corresponding construction of an interferometer arrangement. It is also possible to acquire surface shapes of mirrors of the embodiment of the projection illumination system shown in FIG. 2 using a corresponding construction of an interferometer arrangement.

In FIG. 3, three surface normals 89, erected at different locations of the region 61, are indicated. Further, three angles of incidence a of partial beams of the measuring beam bundle are indicated which are incident onto the region 61. Due to the curvature of the surface 35 and the divergence of the incident measuring radiation, the angles of incidence are not the same at each location on the region 61. However, it is possible to average the angles of incidence across the area of the region 61 to thus determine an average angle of incidence of the measuring radiation onto the surface 35. Also, from the schematic illustration of FIG. 1 it is obvious that the measuring radiation is incident onto the face 35 at a relatively large angle of incidence. In particular, this angle of incidence is greater than 30°.

Figure 4:
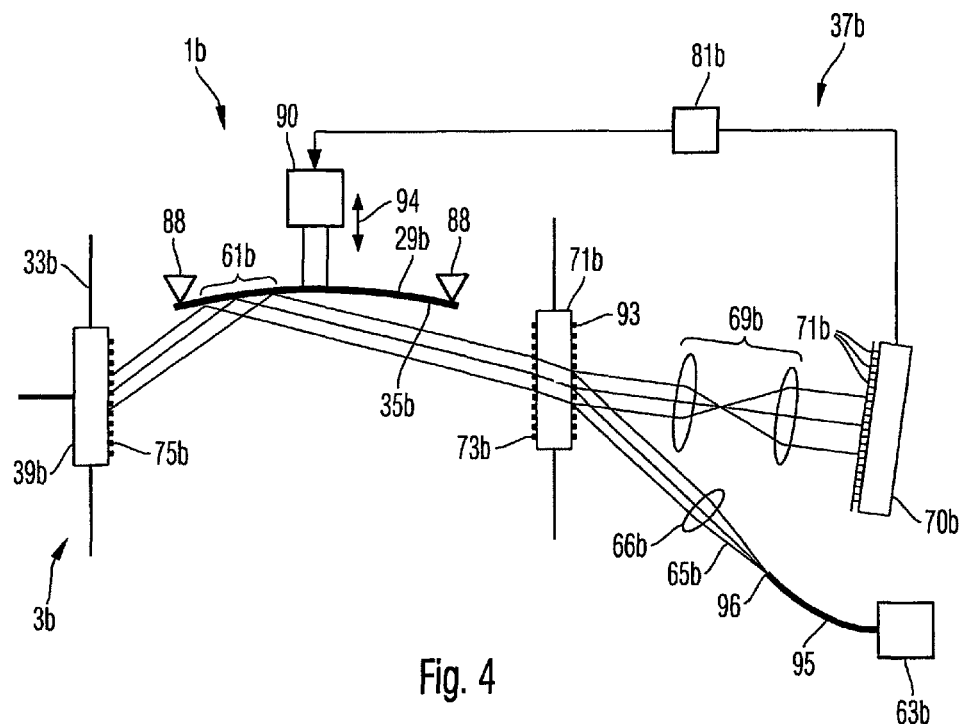
FIG. 4 shows an interferometer arrangement, as it can be integrated, according to a further embodiment, into the projection illumination system of FIGS. 1 and 2.

FIG. 4 shows another embodiment of a projection illumination system 1b. Unlike the embodiment shown in FIG. 3, here an interferometer arrangement 37b of the projection illumination system 1b has another construction. This construction differs from the construction shown in FIG. 3 substantially in that the function of the beam splitter 67 of FIG. 3 is provided by a further CGH 93. From a radiation source 63b, which is arranged apart from an optical face 35b to be measured, measuring radiation is guided via a light duct 95 near to the measurement location, and there leaves a fiber end 96 as a divergent bundle of measuring radiation 65b and is shaped by a collimating optics 66b to become a parallel beam which is incident onto a CGH 93, which is mounted at an outer side of a window 71b of a casing 33b of a projection optics 3b. The CGH 93 diffracts the incident measuring radiation, according to a given diffraction order, so that it is incident on the beam shaping optics adapted as a further CGH 73b to direct the measuring radiation onto an extended region 61b of the optical surface 35b to be measured. From there, the measuring radiation is reflected and is back reflected into itself at a back reflector, again adapted as a CHG 75b, to be again reflected in the region 61b of the optical surface 35b and to be incident onto the beam shaping CGH 73b. There, measuring radiation propagating back towards a detector 70b is diffracted at the same angle as the measuring radiation traversing the CGH 73b and propagating towards the region 61b, to then be incident onto the CGH 93. There, however, the back propagating measuring radiation is diffracted according to a given diffraction order at a different angle than the measuring radiation propagating from the source 63b towards the region 61b, so that the back propagating measuring radiation enters a camera optics 69b to be projected onto the detector 70b.

The CGH 93 is further configured such that it reflects a portion of the measuring radiation 65b coming from the source 63b, namely such that the measuring radiation reflected at the CGH 93, as reference radiation, also enters the camera optics 69b, and such that it generates, in superposition with the measuring radiation back propagating from the region 61b, an interference pattern on the detector 70b.

In the embodiment shown in FIG. 4, the optical component 29b which is measured using the interferometer arrangement 37b is a mirror. A surface shape of the mirror face 35b is changeable, as the mirror is held at the edge by a counter bearing 88, schematically shown in FIG. 4, and a changeable force in a direction illustrated by an arrow 94 can be exerted on the centre of the mirror using an actuator 90. The exerted force is determined by a controller 81b which in turn derives a control signal for the actuator 90 from an analysis of the interference pattern acquired by the detector 70b. The mirror having changeable surface shape is only schematically shown in FIG. 4. Background information regarding such active mirrors may, for example, be gained from EP 1 174 770 A2.

Figure 5:
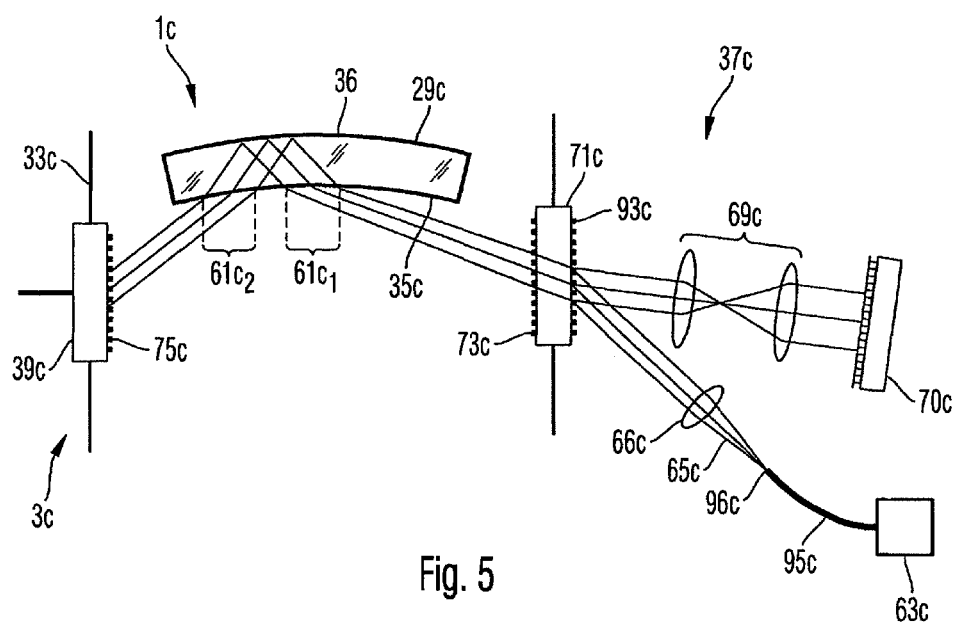
FIG. 5 shows an interferometer arrangement, as it can be integrated, according to a further embodiment, into the projection illumination system of FIG. 1.

FIG. 5 shows a further embodiment of a projection illumination system 1c, comprising an interferometer arrangement 37c which differs from the interferometer arrangement shown in FIG. 4 substantially in that measuring radiation for interaction with a lens 29c to be measured is not only reflected, but also traverses its substrate material. For this measuring radiation is directed through a CGH 37c onto a region 61c, of a surface 35c of the lens 29c. A portion of the measuring radiation is not reflected at the surface 35c but is diffracted and enters the lens 29c, traverses its substrate material and is reflected at the other lens surface 36 inside. The measuring radiation reflected inside at the surface 36 traverses the substrate again and leaves in a region 61c$_2$ through the surface 35c of the lens 29c, and is incident from there onto a CGH 75c which is configured as a back reflector. The back reflected measuring radiation is directed from the CHG 75c onto the region 61c$_2$ in which the measuring radiation partly penetrates into the lens 29c, is reflected at the other lens face 36 inside, leaves in the region 61c$_1$ from the surface 35c of the lens and is incident onto the CGH 73, and is supplied via this and a further CGH 93c and a camera optics 69c to a detector 70c.

The measuring radiation contributing to the reference pattern generated at the detector 70c which has interacted with the lens 29c has thus traversed the substrate of the lens 29c twice. Changes in the interference pattern are thus not only indicative of a change of the surface shape of the faces 35c and 36c of the lens 29c, but also of changes in the refractive index of the substrate material of the lens 29c.

Figure 6:
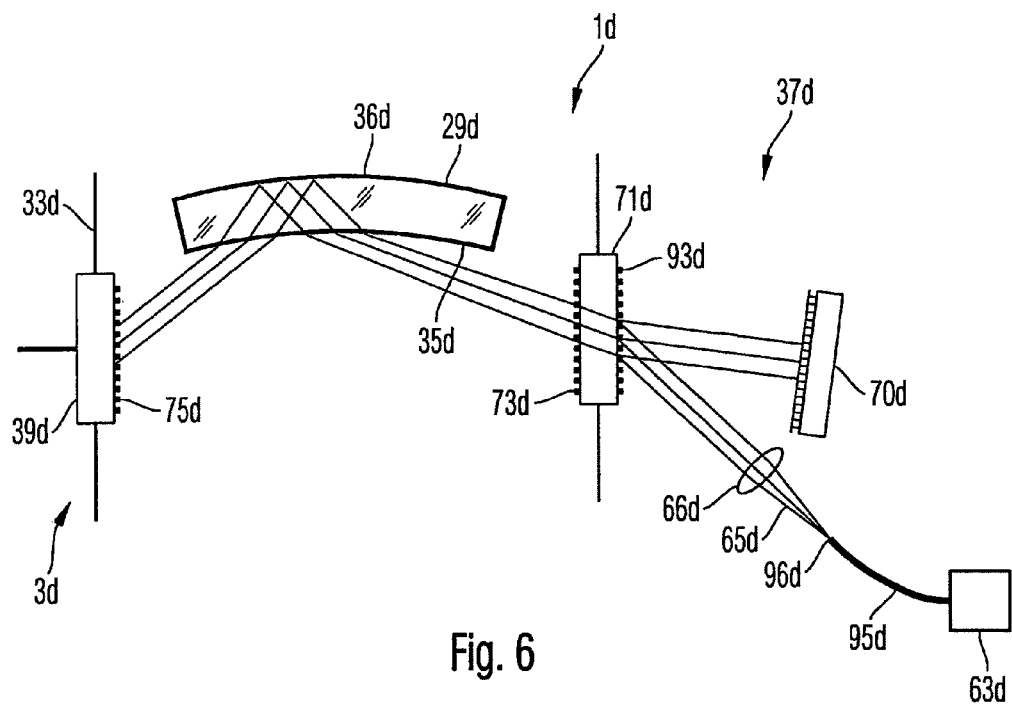
FIG. 6 shows an interferometer arrangement, as it can be integrated, according to a further embodiment, into the projection illumination system of FIG. 1.

FIG. 6 shows a further embodiment of a projection illumination system 1d having an interferometer arrangement 37d, which differs from the interferometer arrangement illustrated in FIG. 5 substantially in that a camera optics (reference number 69a/69b/69c in FIGS. 3, 4 and 5, respectively) is not provided between a beam shaping optics 73d, which reshapes the measuring radiation back propagating from an optical component 29d, and a detector 70d. The measuring radiation and the reference radiation are thus directly transferred to the detector. Such a construction is also referred to as "lens less interferometer" in the literature.

Figure 7:
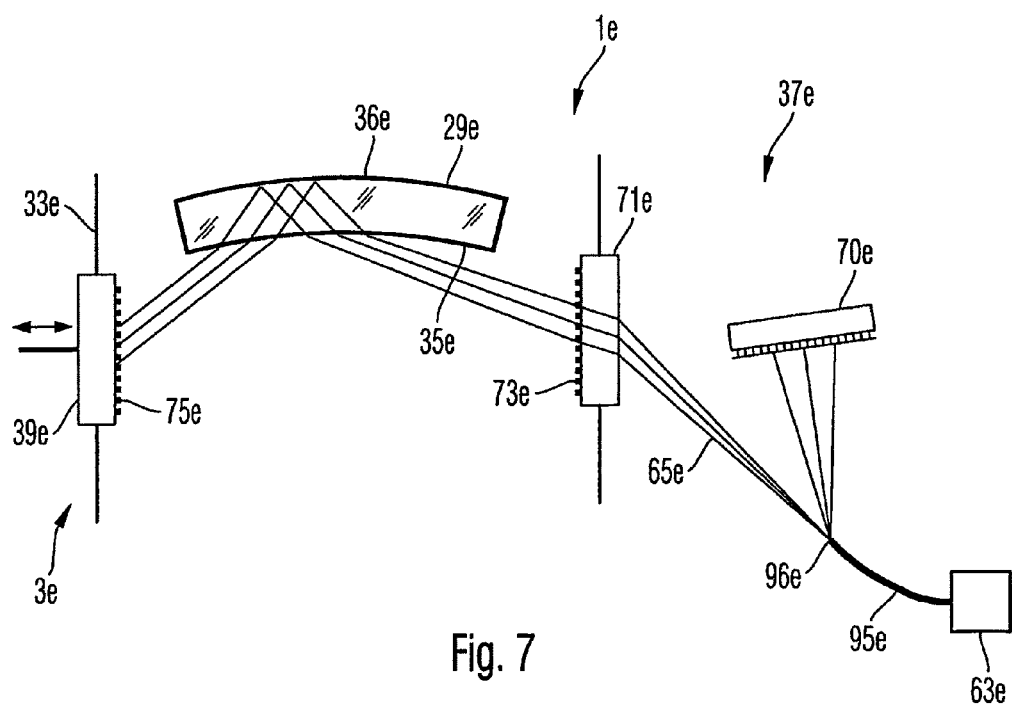
FIG. 7 shows an interferometer arrangement, as it can be integrated, according to a further embodiment, into the projection illumination system of FIG. 1.

FIG. 7 shows a further embodiment of a projection illumination system 1e having an interferometer arrangement 37e, which differs from the arrangements shown in FIGS. 3 to 6, with respect to the construction of the interferometer arrangement. The interferometer arrangement 37e of FIG. 7 has a construction of a so called point-diffraction-interferometer. Radiation generated by a source 63e leaves a fiber end 36e as a spherical wave. A portion 65e of this radiation is used as measuring radiation and is shaped to a measuring beam by the beam shaping optics 73e designed as a CGH, which measuring beam interacts with the optical component to be measured, namely a lens 29e, and is again returned by a back reflector 29e, again traverses the CGH 73e and is thus shaped to a wave bundle spherically back propagating to the fiber end 36e. At the fiber end 36e, a portion of the back propagating radiation is reflected and is then incident onto the detector 70e. However, also incident onto the detector 70e is a portion of the radiation directly leaving the fiber end 36e, which thus forms the reference radiation for generating an interference pattern on the detector. Again, changes of parameters of the optical component 29e to be measured also result in a change of the generated interference pattern. By reading out the generated interference pattern and analyzing the same, actuators, or the like, which are provided in the projection illumination system can be controlled in a compensating manner.

Figure 8:
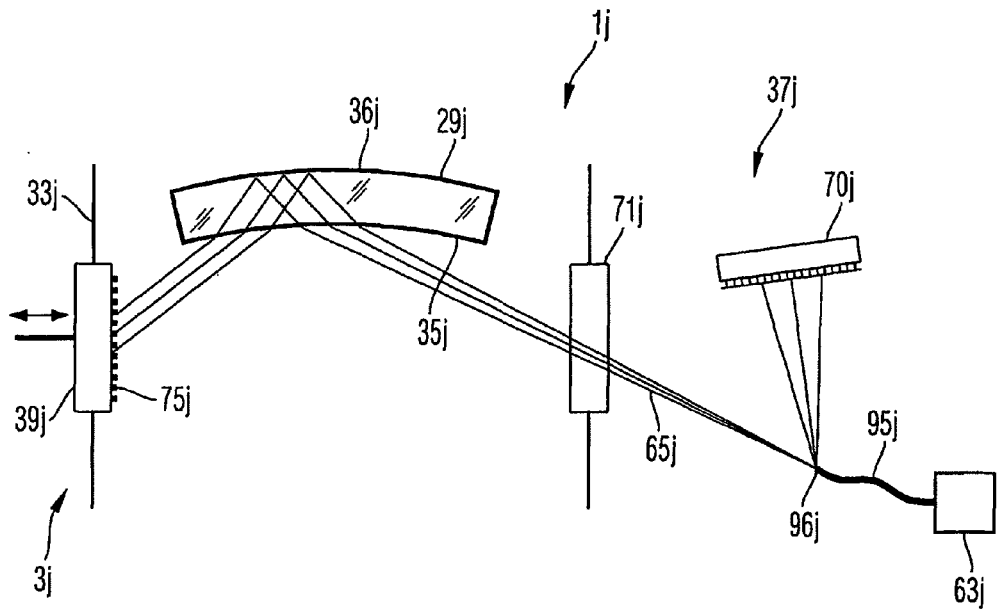
FIG. 8 shows an interferometer arrangement, as it can be integrated, according to a further embodiment, into the projection illumination system of FIG. 1.

FIG. 8 shows a further embodiment of a projection illumination system, which is very similar in construction to the projection illumination system shown in FIG. 7. However, the projection illumination system 1j of FIG. 8 differs from the system shown in FIG. 7 in that between the location of the fiber end 96j, at which the measuring radiation 65j leaves from the radiation source as a free beam, and the surface 35j with which the radiation interacts first, no further beam shaping optics (grating 73e in FIG. 7) is arranged to shape the wave fronts of the measuring radiation. The window 71j, as plane-parallel plate, causes a certain parallel offset of the traversing measuring radiation but this does not result in a substantial change of the shape of the wavefront.

Figure 9:
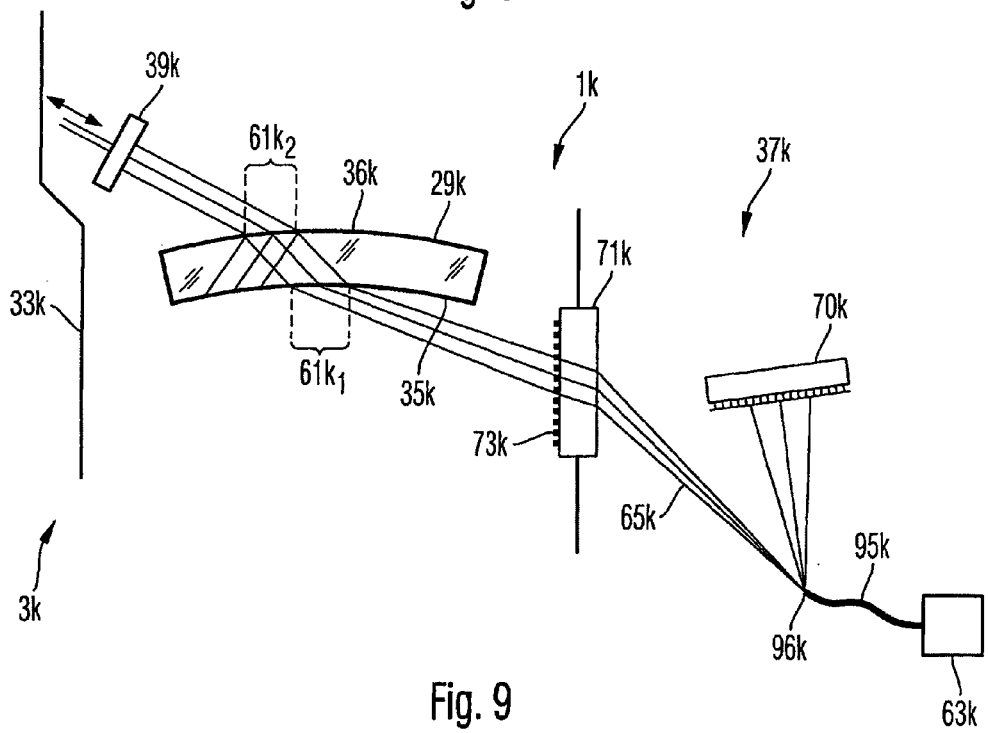
FIG. 9 shows an interferometer arrangement, as it can be integrated, according to a further embodiment, into the projection illumination system of FIG. 1.

FIG. 9 shows a further embodiment of a projection illumination system 1k having an interferometer arrangement 37k, which differs from the interferometer arrangements shown in FIGS. 3 to 8 substantially in that the measuring radiation for interaction with a lens 29k to be measured traverses the same and is not reflected at any of its surfaces 35k and 36k. A back reflector 39k is in this embodiment adapted as a plane mirror, so that the measuring radiation is orthogonally incident onto its mirror face. Accordingly, a diffraction grating 73k, mounted at a window 71k, is adapted such that the measuring radiation is shaped by it so as to propagate as a parallel beam towards the mirror 39k after a refraction at the lens face 35k in an extended region 61$k_1$, traversing the substrate material of the lens 29k, and a further refraction at the lens surface 36k in an extended region 61$k_2$.

In a variant of this embodiment, the diffraction grating 73k may be configured such that the measuring radiation leaving the lens 29k in the region 61$k_2$ exhibits a divergent or convergent beam path, such that it is also returned into itself at the back reflector, for which the back reflector is then adapted as a concave or convex mirror.

On the other hand, in a variant of the embodiment shown in FIG. 9, the back reflector may also be adapted to be a diffraction grating. In this case, the grating 37k may be arranged in the beam path between the radiation source and the first optical surface 35k of the lens 29k, or may also be omitted.

In the embodiment shown in FIG. 9, the interferometer arrangement 37k in other respects exhibits a construction similar to the interferometer arrangements shown in FIGS. 7 and 8. However, it is also possible to modify the interferometer arrangements illustrated in FIGS. 3 to 6 such that the measuring radiation traverses the lens without reflection, in which case the back reflector in those illustrations should then be arranged above the lens, at a similar position to that illustrated in FIG. 9.

Figure 10:
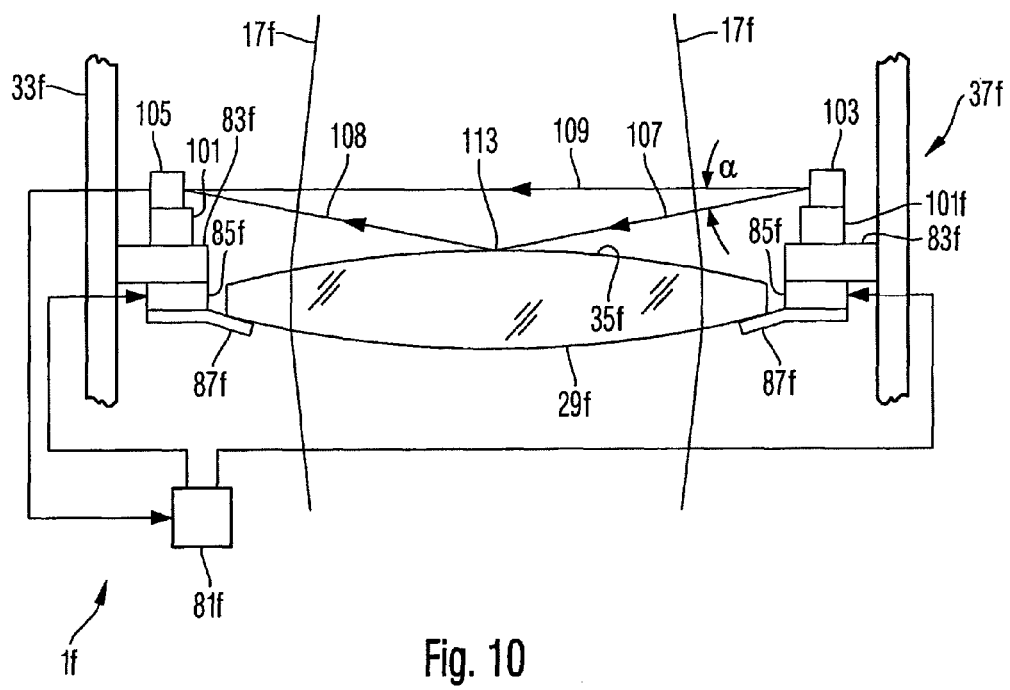
FIG. 10 shows an interferometer arrangement, as it can be integrated, according to a further embodiment, into the projection illumination system of FIG. 1.

A further embodiment of a projection illumination system if having an interferometer arrangement 37f is shown in FIG. 10. A lens 29f which may be arranged in a projection optics or an illumination optics of the projection illumination system if is held in a casing 33f of the optics. The lens 29f itself is mounted in a frame 87f. Between the frame 87f and a holder 83f multiple actuators 85f are inserted, which are controlled by a controller 81f to be able to precisely adjust a position of the lens 29f relative to the casing 33f. For measuring the position of the lens 29f relative to the casing 33f, the projection illumination system if comprises an interferometer arrangement 37f. This interferometer arrangement 37f has a radiation transmitter unit 103 and a radiation detection unit 105 which are mounted on a ring 101 which is held by the holder 83f. The ring 101 is made of a material having a low thermal expansion coefficient, as for example Zerodur. Zerodur has a thermal expansion coefficient of $0.5 \times 10^{-6} \, K^{-}$, which is thus substantially lower than a thermal expansion coefficient of the holder 83f, the components of which are made from steel, for example.

Figure 15:
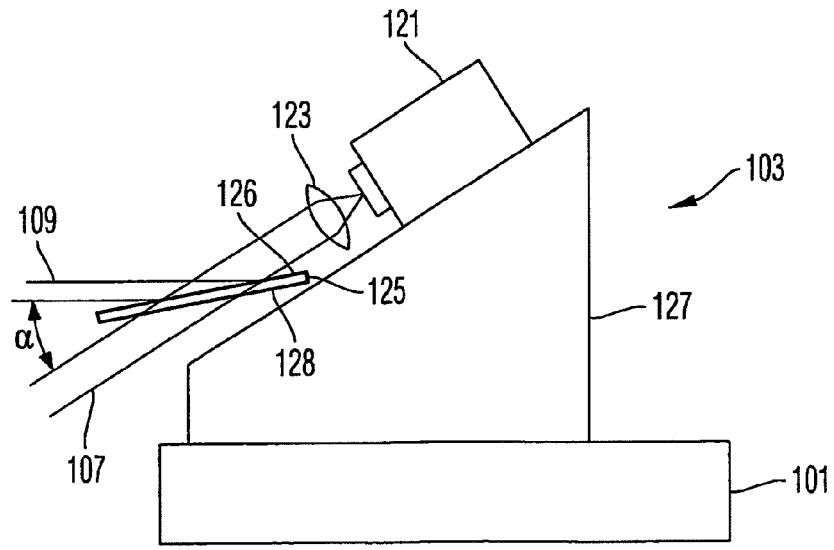
FIG. 15 shows a partial illustration of a radiation transmitter unit shown in FIG. 11.

FIG. 15 shows, in a schematic illustration, details of the radiation transmitter unit 103. On the ring 101, a holder 127 is mounted also forming a heat sink for a semiconductor laser diode 121 and forming a holder for a collimating optics and a beam splitter 125. Radiation emitted from the laser diode 121 is collimated by the lens 122 and is directed onto the beam splitter 125. The beam splitter 125 is a plane-parallel plate having a partially reflecting surface 126 and a non-reflecting surface 128. A portion of the collimated radiation traversing the beam splitter forms a measuring light beam 107, and a portion of the radiation reflected at the beam splitter 125 forms a measuring light beam 109. Both beams 109 and 107 propagate forming an angle α between them.

The beam 109 directly propagates towards a positionally resolving detector in the radiation detection unit 105, while the beam 107 is directed onto a surface 35f of the lens 29f and is reflected back therefrom such that a reflected beam 108 is incident onto the positionally resolving detector in the radiation detection unit 105 in superposition with the beam 109. Since the angle α between the beams 107 and 109 is relatively small, for example 30 or 5°, the angle of incidence of beam 107 onto optical surface 35f of lens 29f is relatively large, in particular greater than 30°.

Both beams 108 and 109 generate an interference pattern on the positionally resolving detector. The positionally resolving detector may be, for example, a two-dimensionally positionally resolving detector, such as a CCD detector. However, for the purposes of this embodiment it is also sufficient that the positionally resolving detector is configured in a more simple manner, and is, for example, only a line detector or a four quadrant detector. Here, namely it is essential that changes in the interference pattern are detectable which are caused by a displacement of the position of the lens relative to the casing. A change in the radiation intensity distribution, detected by the detector, is read out by a controller 81f, which in turn controls the actuators 85f such that changes of the detected radiation intensity distribution are compensated for and thus such that a position of the location 113 at which the beam 107 is incident onto the surface 35f remains constant relative to the casing 33f.

Figure 11:
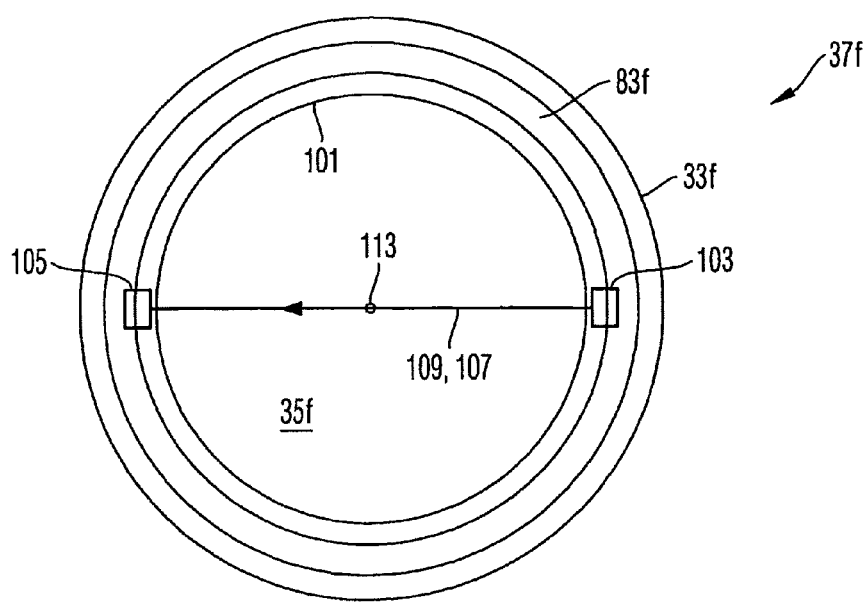
FIG. 11 shows a plan view of the cross-sectional view shown in FIG. 10.

FIG. 11 shows a plan view of the interferometer arrangement 37f shown as a cross-section in FIG. 10. From FIG. 11 it is apparent that the radiation transmitter unit 103 and the radiation detection unit 105 are arranged on the ring 101 opposite to each other, so that the location 113 is arranged in the center on the surface 35f of the lens.

Figure 12:
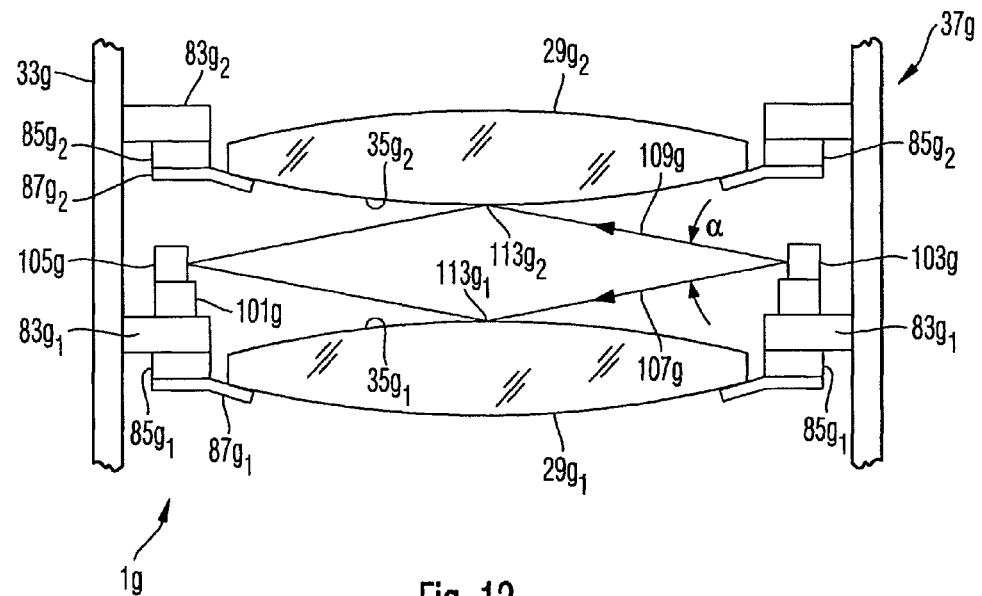
FIG. 12 shows an interferometer arrangement, as it can be integrated, according to a further embodiment, into the projection illumination system of FIG. 1.

FIG. 12 shows a further embodiment of a projection illumination system 1g having an interferometer arrangement 37g for measuring a position of two lenses 29$g_1$ and 29$g_2$ relative to each other. Both lenses 29$g_1$ and 29$g_2$ are each held in a frame 87$g_1$ and 87$g_2$, respectively, which are held via actuators 85$g_1$ and 85$g_2$, respectively, at a holder 83$g_1$ and 83$g_2$, respectively, wherein the holders 83$g_1$ and 83$g_2$ are mounted at a casing 33g of the optics of the projection illumination system 1g. Similar to the embodiment shown in FIG. 10, a radiation transmitter unit 103g and a radiation detection unit 105g of the interferometer arrangement 37g are mounted opposite to each other on a ring 101g, wherein the ring 101g is carried by the holder 83$g_1$.

The radiation transmitter unit 103g emits two beams 107g and 109g which propagate including an angle α relative to each other. The beam 107g is reflected at a location 113$g_1$ from a surface 35$g_1$ of the lens 29g such that the reflected beam is incident onto a positionally resolving detector in the radiation detection unit 105g. Different than for the embodiment shown in FIG. 8 the other beam 109g is not directly incident onto the positionally resolving detector. Instead, the other beam 109g is directed onto a location 113$g_2$ on a lens face 35$g_2$ of the lens 29$g_2$ such that the beam is reflected at the surface 35$g_2$ of the lens 29$g_2$ such that the reflected beam is also incident onto the detector and forms there, together with the beam reflected at the surface 35$g_1$, an interference pattern. If a relative distance between the two points 113$g_1$ and 113$g_2$ changes, the interference pattern generated on the detector changes accordingly and a controller (not shown in FIG. 12) will monitor changing detected radiation intensities. In response thereto the controller may, similar to the embodiment of FIG. 8, control the actuators 85$g_1$ for the position of the lens 29$g_1$ to counter act such changes. In the embodiment illustrated in FIG. 10, the position of the lens 29$g_2$ is also changeable by controlling the actuators 85$g_2$, so that the controller may also control these actuators 85$g_2$ to readjust the relative distance between the two locations 113$g_1$ and 113$g_2$. As both lenses 29$g_1$ and 29$_2$ are held via actuators, a further degree of freedom is provided to compensate for other changes of the imaging quality of the projection illumination system 1g, if required.

Figure 13:
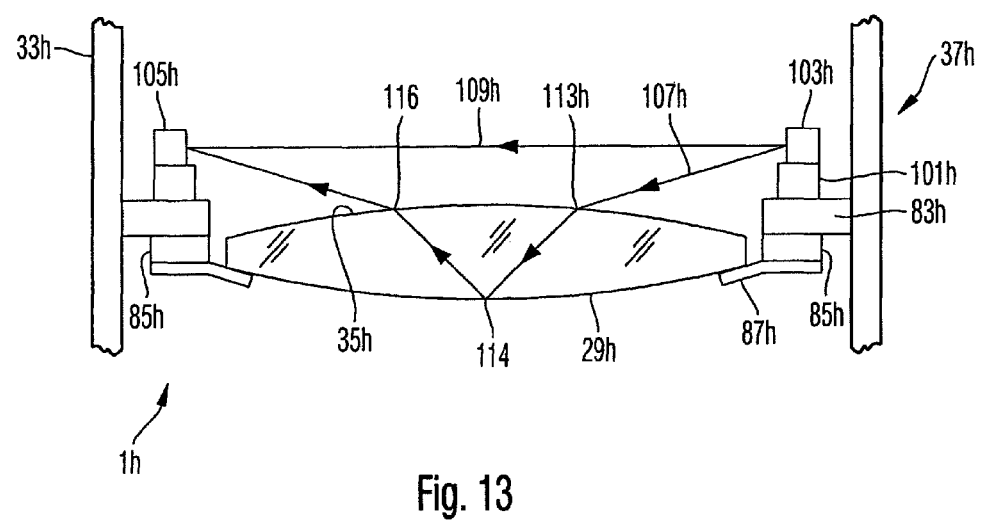
FIG. 13 shows an interferometer arrangement, as it can be integrated, according to a further embodiment, into the projection illumination system of FIG. 1.

FIG. 13 shows a further embodiment of a projection illumination system 1h having an interferometer arrangement 37h. The interferometer arrangement 37h serves to acquire changes of parameters of a lens 29h, and has a construction similar to the interferometer arrangement shown in FIG. 8. From a radiation transmitter unit 103h, two measuring radiation beams 107h and 109h are emitted at a relatively small angle to each other. One of both beams 109h is directly incident on a detector provided in a radiation detection unit 105h, while the other beam 107h interacts with a lens 29h. In contrast to the embodiment shown in FIG. 8, this beam 107 is not reflected at a surface 35h of the lens 29h to then be directly incident onto the detector 105. Instead, the beam 107h is incident at a location 113h on the surface 35h of the lens 29h, and is there, at least partially, refracted, and enters the lens so that it traverses its lens material and is then reflected at the other lens surface 29h at a location 114 inside. After the reflection at the other lens surface 29h, the beam traverses the lens material again and leaves at a location 116 on the surface 35h of lens 29h such that it is incident onto the detector in the radiation detection unit 105h in superposition with the beam 109h.

Changes in the intensity distribution detected by the detector are thus not only indicative of a change of a position of the lens relative to the casing, but also indicative of changes of the refractive index of the lens material, which may also lead to changes or deterioration in the imaging quality of the projection illumination system 1h. A controller, not shown in FIG. 13, may then actuate actuators 85h to change the position of the lens 29h relative to the casing 33h, or may actuate other actuators provided in the projection illumination system 1h to maintain a given imaging quality of the projection illumination system.

Figure 14:
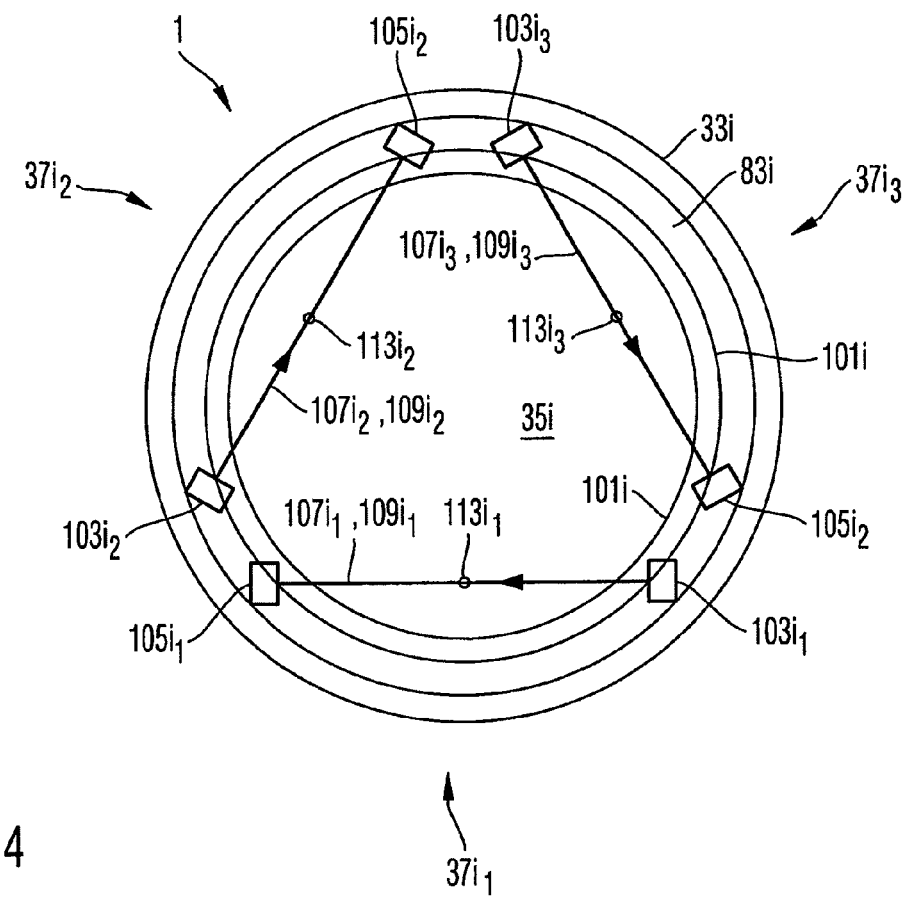
FIG. 14 shows a plan view of an interferometer arrangement according to a further embodiment, corresponding to FIG. 11.

FIG. 14 shows an plan view onto a lens 33i of a projection illumination system 1i in an illustration similar to FIG. 11. Different from FIG. 11, here three separate interferometer arrangements $37i_1$, $37i_2$ and $37i_3$ are provided, each of which comprise a radiation transmitter unit 103i and radiation detection unit 105i. Similar to the arrangement shown in side view in FIG. 10, each transmitter unit transmits two beam 109i and 107i, of which beam 109i is directly incident on the detector of the radiation detection unit 105i, while beam 107i is reflected at a location 113i on the surface 35i of the lens. Due to the spatially separated arrangement of the three interferometer arrangements $37i_1$, $37i_2$ and $37i_3$, the locations $113i_1$, $113i_2$ and $113i_3$ at which beams $107i_1$, $107i_2$ and $107i_3$ are reflected are arranged having a distance from each other on the surface 35i of the lens. Thereby, the positions of the three locations $113i_1$, $113i_2$ and $113i_3$ relative to the casing 33i can be determined, independently from each other, and whereupon also the orientation of the surface 35i can be derived.

The use of three interferometer arrangements explained with reference to FIG. 14 may also be applied to each embodiment of the interferometer arrangements explained above with reference to FIGS. 3 to 11. In addition, two, or more than three interferometer, arrangements may be employed to measure the same optical component.

In summary, a projection illumination system having multiple optical components comprises an interferometer arrangement with components arranged outside a projection beam path of the projection illumination system. Measuring radiation of the interferometer arrangement is incident, in an inclined manner with a large angle of incidence, on a surface of the optical component to be measured. Actuators of the projection illumination system may be controlled dependent on a measured radiation intensity distribution detected by the interferometer arrangement to change imaging properties of the projection illumination system and to keep these stable, in particular with respect to drifts.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A projection illumination system, comprising:
plural optical components disposed in a beam path of a projection radiation with which the projection illumination system is operated, and an interferometer arrangement for inspecting at least one of the plural optical components using measuring radiation,
wherein the measuring radiation is incident, having an angle of incidence of at least 30° relative to surface normals of an optical surface of the optical component, onto the optical surface, and
wherein at least one diffractive optical element is arranged in the beam path of the measuring radiation and is configured to reflect the measuring radiation incident onto the optical surface and having interacted with the optical component back onto the optical surface.

2. A projection illumination system for exposing a substrate with a pattern, wherein the projection illumination system comprises a plurality of optical components and at least one interferometer arrangement for measuring an optical component of the plurality of optical components,
wherein the interferometer arrangement comprises a measuring radiation source, a beam forming optics, a back reflector, and a two-dimensionally positionally resolving beam detector which are arranged outside of a beam path of projection radiation through the projection illumination system and which are configured such that:
measuring radiation emitted by the measuring radiation source, traversing the beam forming optics, is incident onto a first extended area of an optical surface of the optical component to be measured as an extended beam bundle,
the measuring radiation incident onto the optical surface is incident onto the back reflector as an extended beam bundle after a first interaction with the optical component to be measured,
the measuring radiation reflected at the back reflector is incident onto a second extended area of the optical surface of the optical component to be measured,
the measuring radiation incident onto the second extended area of the optical surface enters, after a second interaction with the optical component to be measured, the beam forming optics as an extended beam bundle, and
the measuring radiation entering the beam forming optics is incident onto the two-dimensionally positionally resolving detector in a superposition with reference radiation.

3. The projection illumination system according to claim 2, wherein at least one of the back reflector and the beam forming optics comprises a diffraction grating.

4. The projection illumination system according to claim 2, wherein an average angle of incidence of the measuring radiation being incident onto the first extended area of the optical surface with respect to surface normals of the optical surface is greater than 30°.

5. The projection illumination system according to claim 2, wherein a ratio between an area of the first extended region of the optical surface and an area of a region of the optical surface at which the projection radiation is incident onto the optical surface is greater than 0.1.

6. The projection illumination system according to claim 2, further comprising a casing in which the optical component to be measured is arranged,
    wherein the measuring radiation source is arranged outside the casing,
    and wherein the casing comprises a window for traversal of the measuring radiation towards the optical component to be measured.

7. The projection illumination system according to claim 2, further comprising a casing in which the optical component to be measured is arranged, wherein the diffraction grating is arranged inside the casing and is fixedly connected to the casing.

8. The projection illumination system according to claim 2, wherein the back reflector comprises a first diffraction grating.

9. The projection illumination system according to claim 8, wherein the measuring radiation is reflected at the first diffraction grating.

10. The projection illumination system according to claim 2, wherein the beam forming optics comprises a second diffraction grating.

11. The projection illumination system according to claim 10, further comprising a casing in which the optical component to be measured is arranged,
    wherein the measuring radiation source is arranged outside the casing,
    wherein the casing has a window for traversal of the measuring radiation towards the optical component to be measured,
    and wherein the window comprises the second diffraction grating.

12. The projection illumination system according to claim 2, wherein the interferometer arrangement comprises a reference light reflector, which is arranged in a beam path between the measuring radiation source and the beam forming optics, to reflect a portion of the measuring radiation emitted by the measuring radiation source as the reference light towards the detector.

13. The projection illumination system according to claim 12, wherein the reference light reflector is a semi-transparent mirror.

14. The projection illumination system according to claim 12, wherein the reference light reflector comprises a third diffraction grating.

15. The projection illumination system according to claim 14, wherein the beam forming optics comprises a second diffraction grating,
    and wherein the second diffraction grating and the third diffraction grating are arranged on a common substrate.

16. The projection illumination system according to claim 15, wherein the second diffraction grating is arranged on a first side of the common substrate and the third diffraction grating is arranged on a second side of the common substrate, opposite to the first side.

17. The projection illumination system according to claim 15, wherein the second diffraction grating and the third diffraction grating are arranged on a same side of the common substrate.

18. The projection illumination system according to claim 2,
    wherein the interferometer arrangement comprises a beam splitter which is arranged in a beam path between the measuring radiation source and the reference light reflector.

19. The projection illumination system according to claim 2,
    wherein the interferometer arrangement comprises an actuator, to displace the reference light reflector in a direction of the beam path between the measuring radiation source and the beam forming optics.

20. The projection illumination system according to claim 2,
    wherein the measuring radiation source comprises an optical fiber having a fiber end which forms the beam forming optics and which is arranged relative to the detector such that radiation emitted from the fiber end is emitted as measuring radiation towards the optical surface and as reference radiation towards the detector and
    wherein the fiber end provides a reflector which is disposed in a beam path between the beam forming optics and the detector.

21. The projection illumination system according to claim 2,
    wherein the interferometer arrangement comprises an actuator, to displace the back reflector in a direction of a beam path of the beam bundle being incident onto the back reflector.

22. The projection illumination system according to claim 2,
    wherein a wavelength of the measuring radiation emitted by the measuring radiation source is changeable.

23. The projection illumination system according to claim 2,
    wherein the interaction of the measuring radiation with the optical component to be measured comprises a reflection of the measuring radiation at the first extended region of the optical surface.

24. The projection illumination system according to claim 23, wherein the first extended region of the optical surface is substantially congruent with the second extended region of the optical surface.

25. The projection illumination system according to claim 23, wherein the optical component to be measured comprises a mirror and
    wherein the optical surface is a mirror face of the mirror.

26. The projection illumination system according to claim 25, wherein the mirror comprises an actuator, to change a shape of the mirror face.

27. The projection illumination system according to claim 26, further comprising a controller for controlling the actuator in dependence on an analysis of radiation intensities detected by the beam detector.

28. The projection illumination system according to claim 23, wherein the optical component to be measured comprises a lens, and
    wherein the optical surface is a lens face of the lens.

29. The projection illumination system according to claim 2,
    wherein the optical component to be measured comprises a lens having a first optical surface and a second optical surface, and wherein the interaction of the measuring radiation with the optical component to be measured comprises traversing a substrate material of the lens arranged between the first and the second optical surfaces.

30. The projection illumination system according to claim 29, wherein the first extended region is arranged offset from the second extended region on the first optical surface of the lens, and wherein the interaction of the measuring radiation with the optical component to be measured comprises a reflection of the measuring radiation at the second optical surface.

31. A projection illumination system for exposing a substrate with a pattern, wherein the projection illumination system comprises a plurality of optical components and at least one interferometer arrangement,
wherein the at least one interferometer arrangement comprises a measuring radiation source, a beam forming optics, a beam splitter, and a positionally resolving radiation detector, each of which are arranged outside of a beam path of the projection radiation through the projection illumination system, and which are configured such that
a first collimated measuring radiation beam and a second collimated measuring radiation beam are generated by the measuring radiation emitted by the measuring radiation source, the first measuring radiation beam is directed to a first optical surface of a first optical component such that an angle of incidence of the first measuring radiation beam, with respect to surface normals of the first optical surface, is greater than 30°,
the first measuring radiation beam being incident onto the first optical surface of the first optical component is incident onto the radiation detector after a reflection at the first optical component, and
the second measuring radiation beam passes beside the first optical component and is incident in superposition with the first measuring radiation beam onto the radiation detector,
wherein the first optical component is a lens, and
wherein the reflection of the first measuring radiation beam is carried out at a second optical surface of the lens opposite to the first optical surface.

32. A projection illumination system for exposing a substrate with a pattern, wherein the projection illumination system comprises a plurality of optical components and at least one interferometer arrangement,
wherein the at least one interferometer arrangement comprises a measuring radiation source, a beam forming optics, a beam splitter, and a positionally resolving radiation detector, each of which are arranged outside of a beam path of the projection radiation through the projection illumination system, and which are configured such that
a first collimated measuring radiation beam and a second collimated measuring radiation beam are generated by the measuring radiation emitted by the measuring radiation source, the first measuring radiation beam is directed to a first optical surface of a first optical component such that an angle of incidence of the first measuring radiation beam, with respect to surface normals of the first optical surface, is greater than 30°,
the first measuring radiation beam being incident onto the first optical surface of the first optical component is incident onto the radiation detector after a reflection at the first optical component, and
the second measuring radiation beam passes beside the first optical component and is incident in superposition with the first measuring radiation beam onto the radiation detector,
wherein the second measuring radiation beam experiences a reflection between one of the beam forming optics and the beam splitter, and the radiation detector, and
wherein the reflection of the second measuring radiation beam is carried out at a second optical component of the projection optical system different from the first optical component.

* * * * *

UNITED STATES PATENT AND TRADEMARK OFFICE
CERTIFICATE OF CORRECTION

PATENT NO. : 8,228,485 B2
APPLICATION NO. : 12/129235
DATED : July 24, 2012
INVENTOR(S) : Rolf Freimann and Jens Philipps It is certified that error appears in the above-identified patent and that said Letters Patent is hereby corrected as shown below:

Title Page, item (56); Column 2, line 9: delete "Priciple" and insert -- Principle --
Column 5, Line 62: delete "248 µm." and insert -- 248 nm. --
Column 9, Line 52: delete "61c," and insert -- $61c_1$ --
Column 9, Line 64: delete "61c," and insert -- $61c_1$ --
Column 11, Line 26: delete "if" and insert -- $1f$ --
Column 11, Line 28: delete "if" and insert -- $1f$ --
Column 11, Line 35: delete "if" and insert -- $1f$ --
Column 11, Line 41: delete "K" and insert -- $K^{-1}$ --
Column 11, Line 65: delete "30" and insert -- 3° --
Column 12, Line 61: delete "$29_2$" and insert -- $29_{g2}$ --

Signed and Sealed this
Twenty-third Day of October, 2012

David J. Kappos
*Director of the United States Patent and Trademark Office*